United States Patent
Archie et al.

(10) Patent No.: US 7,760,360 B2
(45) Date of Patent: Jul. 20, 2010

(54) MONITORING A PHOTOLITHOGRAPHIC PROCESS USING A SCATTEROMETRY TARGET

(75) Inventors: Charles N. Archie, Granite Springs, NY (US); Matthew J. Sendelbach, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 11/820,305

(22) Filed: Jun. 18, 2007

(65) Prior Publication Data

US 2008/0158564 A1      Jul. 3, 2008

Related U.S. Application Data

(62) Division of application No. 10/605,751, filed on Oct. 23, 2003, now Pat. No. 7,265,850.

(51) Int. Cl.
*G01N 21/55*     (2006.01)
*G01B 11/14*    (2006.01)
*G03F 9/00*     (2006.01)
*G03C 5/00*     (2006.01)
*G03B 27/32*    (2006.01)

(52) U.S. Cl. .................. 356/445; 356/625; 430/22; 430/30; 355/77

(58) Field of Classification Search ............... None
See application file for complete search history.

(56) References Cited

U.S. PATENT DOCUMENTS

| | | | | |
|---|---|---|---|---|
| 5,596,413 | A * | 1/1997 | Stanton et al. | 356/401 |
| 6,458,605 | B1 * | 10/2002 | Stirton | 438/7 |
| 6,602,727 | B1 * | 8/2003 | Rangarajan et al. | 438/14 |
| 7,262,864 | B1 * | 8/2007 | Markle et al. | 356/625 |

* cited by examiner

*Primary Examiner*—Tarifur Chowdhury
*Assistant Examiner*—Gordon J Stock, Jr.
(74) *Attorney, Agent, or Firm*—Wenjie Li; Daryl K Neff

(57) ABSTRACT

A method is provided for monitoring a photolithographic process in which a substrate is patterned to form (i) a scatterometry target having a plurality of parallel elongated features, and desirably, (ii) other features each having at least one of a microelectronic function or a micro-electromechanical function. Desirably, each elongated feature of the scatterometry target has a length in a lengthwise direction and a plurality of stress-relief features disposed at a plurality of positions along the length of each elongated feature. A return signal is detected in response to illumination of the scatterometry target. The return signal can be used to determine a result of the photolithographic process.

9 Claims, 9 Drawing Sheets

MONITORING A PHOTOLITHOGRAPHIC PROCESS USING A SCATTEROMETRY TARGET

CROSS-REFERENCE TO RELATED APPLICATION

This application is a division of U.S. application Ser. No. 10/605,751, filed Oct. 23, 2003 now U.S. Pat. No. 7,265,850 the disclosure of which is incorporated by reference herein.

BACKGROUND OF THE INVENTION

The present invention relates to the measurement of features that are patterned by photolithographic techniques, and more particularly to such measurement using scatterometry.

A variety of articles such as integrated circuits and microelectromechanical machines have micro-scale and nano-scale structures that are patterned on a substrate or wafer by photolithographic techniques. Such structures have critical dimensions ranging in size from tens of nanometers to a few hundred nanometers and single microns. Critical dimensions are structural details in a product that have been identified as key to monitoring and controlling the manufacturing process. The structural detail is required to be within a certain range or tolerance of a design size. Failure of the structural detail measurement to be within tolerance of the design size initiates corrective actions such as rework and process control parameter change.

When fabricating such nano- and micro-scale structures, measurements of critical dimensions must be taken at several stages during fabrication. In this way, the results of prior processing are measured and checked against tolerances to determine if acceptable. If the results of prior processing are not acceptable, the wafer is removed from the manufacturing line, before additional process steps are performed and costs incurred. Actions are then applied to the manufacturing line to correct process problems.

An existing metrology technique for performing such measurements is known as critical dimension scanning electron microscopy ("CDSEM"). CDSEM is a dominant metrology technique used in semiconductor and other nano-scale manufacturing. In CDSEM, a beam of electrons having a spot size of a few nanometers (typically five to 10 nm) is scanned in a raster pattern across the surface of a sample to be imaged. The electrons of the beam striking the surface cause secondary electrons to be given off from the sample. A detector of the scanning electron microscope picks up a signal representative of the secondary electrons, which is then processed to drive a display which is raster scanned in unison with the electron beam. The resolution of CDSEM depends upon a number of factors including the spot size of the electron beam on the sample.

CDSEM is an expensive measurement technique. CDSEM is expensive because electron microscopes require electron sources and focusing elements that are orders of magnitude more expensive than optical systems that use light. It also has insufficient throughput to operate on more than a handful of wafers that are pulled from the manufacturing line as samples representative of the manufacturing process.

A disadvantage of CDSEM is that only features on the surface of a sample can be imaged because the electron beam does not penetrate beneath the surface. When features below the surface of a sample are to be measured, other instruments must be used. CDSEM is one of a class of instruments known as a reference measurement system (RMS). Other RMS instruments include CDAFM, cross section SEM, and other metrology instruments. CDAFM is an atomic force microscope designed to make critical dimension measurements. Cross section SEM is a specially designed scanning electron microscopy system used to image and measure a patterned wafer in cross section. When a buried structure of a wafer is measured by cross section SEM, the wafer is cleaved, i.e., intentionally fractured along a lattice boundary of the semiconductor crystal. The cleft exposes critical dimension features for measurement, and an electrographic image is taken of the feature. Cross section SEM operates destructively. After the wafer is cleaved, it cannot be processed further in the manufacturing line, and thus the wafer is rendered unusable.

The speed of a metrology system is generally defined in terms of move acquire measure (MAM) time. The MAM time includes: a) the time required to move the article to be measured from one measurement location to another; b) to locate the new site to be measured (which may necessitate acquiring an image for pattern recognition); and c) to take the measurement. CDSEM provides a longer than desirable MAM time. CDSEM requires the sample to be placed in a high vacuum with the CDSEM tool. Therefore, each time a wafer is imaged, the tool must be brought to atmospheric pressure to permit the wafer to be loaded into a chamber housing the tool and wafer, and the chamber must then be pumped to a high vacuum, typically $10^{-7}$ torr or less. In addition, the constraints of electron beam imaging force CDSEM measurements to be taken over a relatively small area of the wafer. Because of that, the measurement from just one location of a wafer may not be generally representative of prior processing. Therefore, CDSEM tools typically take several measurements from different locations of the wafer, e.g. five locations, and take the average of the measurements as being representative of prior processing. Thus, the MAM time per wafer for a CDSEM tool requires load and unload time for placing the wafer in the vacuum with the tool, and the time for taking the measurements at the required number of different locations (e.g. five) of the wafer.

CDSEM provides an appropriate basis for comparing the accuracy and precision of other measurement systems, as well as cost-of-ownership ("COO"). Cost of ownership ("COO") is defined as the total cost of using an instrument or process in manufacturing. Key elements in determining the COO are equipment purchase and maintenance cost, and throughput in using the equipment. For metrology instruments, throughput depends on several factors including the MAM time, and the number of locations of the wafer to be measured. CDSEM, while providing adequate measurement accuracy and precision, has less than desirable COO. As mentioned above, electron beam imaging systems are very costly to purchase and maintain. In addition, throughput is undesirably low, for the reasons discussed above—making the cost per wafer high for using the tool.

Scatterometry now provides an acceptable alternative to CDSEM for measuring micro-scale and nano-scale features that are formed by photolithographic techniques. Scatterometry is an optical measurement technique that is both nondestructive and which can operate in-line, without requiring wafers to be taken out of the manufacturing line. Scatterometry operates by measuring the characteristics of light or other radiation that diffracts or "scatters" off a grating, the grating being representative of features of the wafer to be measured. Such grating, also called a "target", typically has lines of dimensions comparable to a critical dimension of the features.

Until recently, the calculations required by scatterometers to analyze the return signal in relation to the critical dimension were too computationally intensive to perform with acceptable MAM time. With recent advances in computing, that situation has now changed, and scatterometers are now available which provide acceptable MAM time.

Scatterometers differ in light sources, scattering conditions, and method for analyzing the return signal coming back from the target. Scatterometers are available for use with simple line grating targets to determine critical dimensions such as structure bottom width, structure sidewall angle, and structure height. Given future advances in computing, it is expected that scatterometry will be able to analyze light scattered off of arrays of more complicated structures such as contact holes and in-chip periodic structures.

Scatterometry offers several advantages over CDSEM for measurement of critical dimension features. Scatterometry measurements are performed at atmospheric pressure. Thus, scatterometry avoids the load and unload time of CDSEM tools for placing a wafer in a high vacuum for taking measurements. In addition, because of the large size of the targets used in scatterometry, a single measurement inherently averages out line edge roughness and other random variations in the grating. As discussed above, in CDSEM several measurements must be performed to average out roughness in the sample. In addition, the capital cost of a scatterometer is generally lower than a CDSEM tool. These advantages allow scatterometry to provide increased throughput and lower COO relative to CDSEM.

Unlike CDSEM, scatterometry techniques can detect materials and structures buried beneath the wafer surface. Another future application may be to use scatterometry for overlay metrology.

Scatterometry provides other advantages. It is expected that new critical dimension metrics such as sidewall angle and structure height will become necessary. Such metrics can help to better measure printing and etching processes in nanoscale manufacturing, which processes are plagued by loss of fidelity between the intended feature shapes and those that actually result. Scatterometry provides these new metrics. CDSEM does not provide such metrics.

Another advantage of scatterometry systems is that they can be integrated into process equipment used for etching and lithography. Some such process equipment targets a throughput of 120 wafers per hour. Because of the long MAM time of CDSEM tools that require measurements to be performed in a high vacuum, a CDSEM tool cannot meet this performance objective. Accordingly, only optical measurement tools are considered in connection with such high throughput process equipment.

A good scatterometry target mimics features of the operational area of the sample, having elements that vary in proportion to the variation in the sample features due to the manufacturing process that is performed. A grating formed in a layer of an article to be measured, having lines of the same critical dimension as the features of the layer, provides a good scatterometry target. With such grating, variations in the manufacturing process cause the grating to change in the same way as the critical dimension features.

Scatterometry targets must be at least a certain size in order to provide a return signal having adequate signal-to-noise ratio. This is due to the following. Critical dimension features are typically smaller than the wavelength of light used in scatterometry. In manufacturing semiconductor devices, lithography is used to define critically dimensioned features at nominal widths of less than 100 nm. On the other hand, available scatterometers use light having wavelengths greater than 200 nm. The situation is even more challenging than inferred by these numbers since the precision and accuracy of the critical dimension measurement must be kept within a small fraction of the nominal measurement, e.g. to within about 2%. To achieve this level of measurement quality, the light must be scattered from many lines in the grating, for example 40 lines or more. The minimum number of lines determines the minimum acceptable grating size, and a minimum spot size for the light beam, as well. Additional constraints on the minimum grating size are imposed relating to the accuracy of directing the beam onto the grating.

On the other hand, the maximum size of the scatterometry target is limited by the area available for such target on the wafer, as the scatterometry target must compete for wafer area with other targets used for other types of metrology systems. In summary, while there is incentive to make the grating of a scatterometry target as small as possible, the requirements for precision impose a minimum size. Today, no commercially available scatterometer can precisely measure key parameters of critical dimension features with a grating smaller than 50 µm by 50 µm.

An example of a grating used as a conventional scatterometry target 10 is illustrated in FIG. 1. The grating 10 consists of parallel-oriented lines 11, each having the same width 15 as the width of critical dimension lines in an operational area of a wafer, and a spacing 14 which is the same as the spacing between the critical dimension lines. In such target, the dimensions 12, 13 of the grating are about 50 µm on a side.

Some types of prior art scatterometry systems are illustrated in FIGS. 2A through 2C. Types of conventional scatterometry systems include normal incidence spectroscopic reflectometry (FIG. 2A), spectroscopic ellipsometry (FIG. 2B), and two-theta fixed-wavelength ellipsometry (FIG. 2C).

In a normal incidence spectroscopic reflectometry system as shown in FIG. 2A, a broadband source 213 produces white light, having wavelengths between 200 nm and 800 nm. The light is focused by a lens system 214 and passed through a beam splitter 215 as a spot onto the target 212 of the sample 211. The return signal scattered off of the sample is then reflected by the beam splitter 215 and passed through further optics 216 onto a detector 217. The detector uses a prism or grating to separate the return signal into its constituent wavelengths. As shown at 218, reflectivity is then determined as a function of wavelength from the separated light.

In a spectroscopic ellipsometry system as shown in FIG. 2B, the light from a white light source 223, having wavelengths between 200 nm and 800 nm, is focused by a lens 224 onto a grating 222 of a sample 221. The light is reflected off of the grating 222 at a fixed angle of incidence and focused through a lens 225 onto a detector 226 having a prism or grating for separating the scattered light into its constituent wavelengths. The zeroth order diffracted light is then detected. The zeroth order light is that which scatters off at an angle that is equal to the angle of incidence. Rotating polarizers 228 and 229 are provided in the incident beam and the scattered beam of the return signal, respectively. As shown at 227, changes in the degree to which the returned light has transverse electric (TE) and transverse magnetic (TM) polarization are recorded as a function of wavelength.

With a two-theta fixed-wavelength ellipsometry system, as shown in FIG. 2C, a single wavelength of light from a source such as a helium-neon laser 233 is focused by a lens 234 onto a grating 232 of a sample 231. As in the system shown in FIG. 2B, the light is reflected off of the grating 232 at a fixed angle of incidence and focused through a lens 235 onto a detector 236 having a prism or grating for separating the return signal into its constituent wavelengths. As in that system, the zeroth order diffracted light is detected as a function of the angle of incidence. Again, rotating polarizers 239 and 240 are provided in the incident beam and the scattered beam of the return signal, respectively. During the course of a measurement the angle of incidence 238 and the scattered angle are kept equal and swept through a range of angles. As shown at 237, changes in the degree to which the returned light has transverse electric (TE) and transverse magnetic (TM) polarization are recorded as a function of the angle of incidence.

In principle, when the geometry of the grating and the optical properties of the materials involved are known, the scattering properties of the electromagnetic radiation incident upon the sample can be determined by solving Maxwell's equations. That is, the return signal from the sample varies in certain expected ways. From the known geometry and optical properties, properties including the variation in reflectivity with wavelength, variation in polarization with wavelength, variation in polarization with angle of incidence can be determined.

In general, however, the inverse problem cannot be solved. That is, the geometry of the grating generally cannot be determined, even with knowledge of the scattering properties and the optical properties of the materials.

With the inability to solve for the geometry of the grating, scatterometry systems rely instead upon the correlation of return signal characteristics with return signals obtained from simulations of samples having known characteristics. Such techniques operate as follows. An initial guess is made concerning the geometry of the grating to be measured. The scattering properties of the grating are measured, by which a return signal is measured in terms of spectra. The difference between the calculated and measured spectra is then determined. The difference is used to make a better guess as to the actual geometry. To decide whether the new guess is better than the first, a Chi-square sum of least squares quantity is calculated. The Chi-square quantity is the sum of squares of all the differences in spectra between the return signal and that calculated signal, over all wavelengths or angles of incidence. The smaller the Chi-square quantity, the closer the fit is between the measured return signal and the calculated signal.

One problem with the Chi-square sum of least squares approach is the local minima problem. The Chi-square quantity is a function of many parameters, all of which are allowed to vary in the geometry model. Thus, varying parameters of the model to search for the true minimum Chi-square value could lead to a local minimum in the multi-parameter Chi-square surface, rather than the true minimum corresponding to the true geometry.

A common way of overcoming the local minima problem to determine the true geometry is to search the whole parameter space in fine steps using a library based approach. With experience and some supporting metrology, a model of the grating is determined which includes those dimensions that can vary when the instrument is used.

FIG. 3 illustrates an example of a model for measuring such grating geometry. The model represents a sample to be measured having recurring resist patterns 30 of trapezoidal cross-section. The resist patterns are disposed over an unpatterned anti-reflective coating (ARC) layer 31, which in turn is disposed over other unpatterned underlayers 32 through 37 of various materials and thicknesses. Some of these thicknesses may need to be variable (floating) in the model description from which a library of spectra signatures is derived. It is known from experience that the height 25, sidewall angle 26, and bottom width 27 of the recurring trapezoidal patterns can change depending on lithography process conditions. Therefore, these properties are allowed to vary. Accordingly, the scattering spectra must be calculated for every possible value of these properties. Assuming that the bottom width 27 can vary between any value from 21 nm to 100 nm in one nm steps (chosen because of our accuracy and precision requirements), then there is a total of 80 different values for bottom width. Similarly, the sidewall angle 26 can be allowed to vary in one degree steps between 85 and 94 degrees for a total of 10 different angle values. In addition, the height 25 is allowed to vary in one nm steps between 151 nm to 250 nm for a total of 100 different height values. All combinations are calculated for a total of 80,000 spectral signatures. This is while assuming that the thickness of any underlayer remains constant, when in fact it may vary, and affect the measurements that are made. Thus, if underlayer variation is to be considered, an even greater number of spectral signatures must be calculated. In such manner, the spectral signatures of a geometric model library are determined and stored. At measurement time, the measured spectra are compared to the libraried spectra by a Chi-square approach to determine the best fit. The geometric properties of the model having the smallest Chi-square quantity are then selected as the best fit.

A variation on the library-based solver is to use a coarse library having large step sizes for the floating parameters to determine an approximate solution. This solution is assumed to be near the true minimum on the Chi-square surface. Therefore, mathematical techniques can be employed to "linearize" the problem and regress to the true minimum. In scatterometry systems, both techniques are desirably used to reduce the quantity of calculations that are required.

Unfortunately, the relatively large size of the scatterometry grating (50 μm) introduces additional lithographic printing problems or constraints, compared to the printing of the critical dimension element of the chip, which has a size typically smaller than one μm. Pattern collapse is a condition in which photoresist lines fall over, for example. Pattern collapse can occur in such large targets, making them unusable, even when the in-chip element has printed acceptably. Pattern collapse radically changes the geometry in unpredictable ways, making scatterometry results unreliable.

Therefore, it is highly desirable for the lines of the grating to remain standing whenever the printed element of the chip is standing so that scatterometry measurements track the properties of the printed element. In other words, the grating should be as robust as or better than the critical dimension printed element.

Pattern collapse is not unique to targets used in scatterometry. There are other situations where pattern collapse occurs. In the development of lithography processes, it is frequently necessary to cross section wafers by cleaving. Because the cleave crack can wander, target patterns have been designed into test reticles having arrays of long lines to improve the chance that the cleave crack will run through the lines.

As shown in FIGS. 4 and 5, to help avoid pattern collapse, some target patterns include bridges 20 (FIG. 4) or gaps 22 (FIG. 5). As long as the cleave crack runs through the lines 21 and not the bridges 20 or gaps 22, a suitable cross section is obtained. However, if the cleave crack intercepts the bridge or travels along the gaps, the cross section fails. For this reason these alterations of the simple line array are placed sparingly to make such interceptions improbable. Sometimes the alterations are placed along non-orthogonal directions, as shown in FIG. 5, so that even if the cleave crack intercepts one of the alterations, there will be other valid structures to measure. For taking the cross section, as long as the alterations do not interfere with the cross section measurement site, there is no measurement impact from these alterations.

While such alterations are suitable for patterns used to measure cleaved cross section sites, such as in scanning electron microscopy (SEM), it is quite another thing to apply such bridges and gaps to scatterometry gratings. Given the nature of the scatterometry measurement where scattered light from all structures within the probe beam spot contributes to the measurement, these pattern reinforcements would be expected to alter the spectra and also the measurement derived therefrom. In addition, the state of scatterometry modeling today only permits simple gratings to be modeled. Accordingly, heretofore, there has been no way to include such alterations in a scatterometry target in a way which permits a model to accurately represent them.

Accordingly, it would be desirable to provide a scatterometry target that mimics the behavior of critical dimensions of in-chip circuit elements, while having patterns that avoid collapsing. Such scatterometry target must also have good scattering properties for scatterometry measurement and analysis.

It would further be desirable to provide a scatterometry target having features that change more than the critical dimension features of the in-chip circuit elements due to manufacturing process variation. With such scatterometry target, pattern collapse is avoided while a scatterometry measurement is provided having a greater sensitivity to manufacturing process variation than the in-chip circuit element.

SUMMARY OF THE INVENTION

According to an aspect of the invention, a scatterometry target is provided having a plurality of parallel elongated features, each having a length in a lengthwise direction. A plurality of stress-relief features are disposed at a plurality of positions along the length of each elongated feature.

According to a preferred aspect of the invention, the stress-relief features of the scatterometry target grating are provided in the form of bridges between the lines to prevent collapse of the lines.

According to another preferred aspect of the invention, the stress-relief features of the scatterometry target grating are provided in the form of gaps in the lines.

According to another aspect of the invention, a scatterometry target is provided which includes a plurality of parallel elongated features each having a length in a lengthwise direction. Each of the elongated features have jogs disposed at a plurality of locations along the length, the jogs causing the scatterometry target to produce a return signal which is sensitive to photolithographic process conditions.

According to a preferred aspect of the invention, such scatterometry target having jogs is sensitive to defocus and dose.

According to another aspect of the invention, a method is provided for monitoring photolithographic process. The method includes providing a scatterometry target having a plurality of parallel elongated features, each such feature having a length in a lengthwise direction and a plurality of stress-relief features disposed at a plurality of positions along the length of each such elongated feature. The method includes illuminating the scatterometry target, detecting a return signal from the scatterometry target, and comparing the return signal to signals of a library of stored signals to determine a match. The photolithographic process is monitored based on the match that is determined.

According to a further preferred aspect of the invention, gaps in the lines of the scatterometry target are provided so that the lines are shorter than the threshold length at which line collapse will occur.

According to another preferred aspect of the invention, gaps in the lines and bridges between the lines of the scatterometry target are provided in equal measure of optical volume as to avoid line collapse and to produce cancellation of the effects of these alterations on the scatterometry measurement.

According to another preferred aspect of the present invention, jogs are introduced in the grating pattern thereby avoiding line collapse and producing no net alteration of the scatterometry measurement.

According to yet another aspect of the invention, bridges, gaps, and jogs are introduced in the grating pattern to a high degree, thereby avoiding line collapse and providing a target with properties exhibiting greater sensitivity to manufacturing process change than in-chip critical dimensions of circuit elements.

According to yet another preferred aspect of the invention, the scatterometry targets of the present invention are calibrated when necessary so that a correction formula is provided to conventional scatterometry analysis to account for the presence of bridges and/or gaps and/or jogs in the target.

DETAILED DESCRIPTION

According to embodiments of the invention, scatterometry target gratings are provided having a plurality of parallel elongated lines extending in a lengthwise direction. The lines of the grating are fortified against pattern collapse by stress relief features. The stress-relief features protect the grating against the lateral stresses that act upon the lines of the gratings. Examples of such stress relief features are gaps, i.e., breaks, and/or jogs in the lines of the grating. Another type of stress-relief feature which can be used are bridges provided between lines of the grating. The bridges connect at least adjacent pairs of the elongated lines in a direction that is transverse to the lengthwise direction of the lines. In a preferred embodiment, the bridges run across the grating in the transverse direction, connecting a multiplicity of the lines.

In a preferred embodiment, both gaps and bridges are provided having equal optical volume such that the gaps and bridges compensate for the other, leaving the scatterometry solution unaffected. Optical volume is defined as the volume of a structure, determined by its geometry, multiplied times the index of refraction of the material within the volume.

Figure 1:
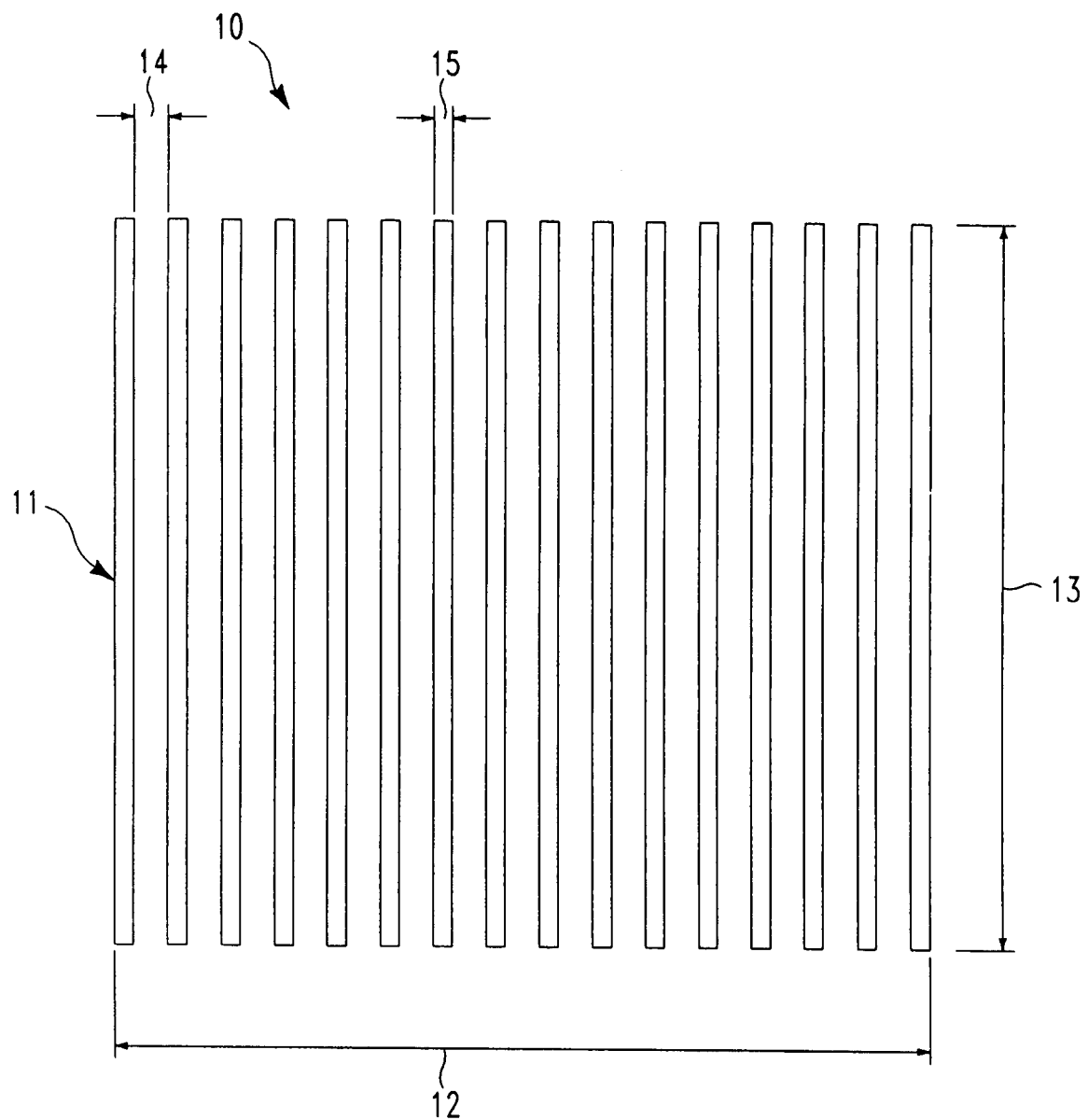
FIG. 1 illustrates a conventional scatterometry grating target.
Figure 2A:
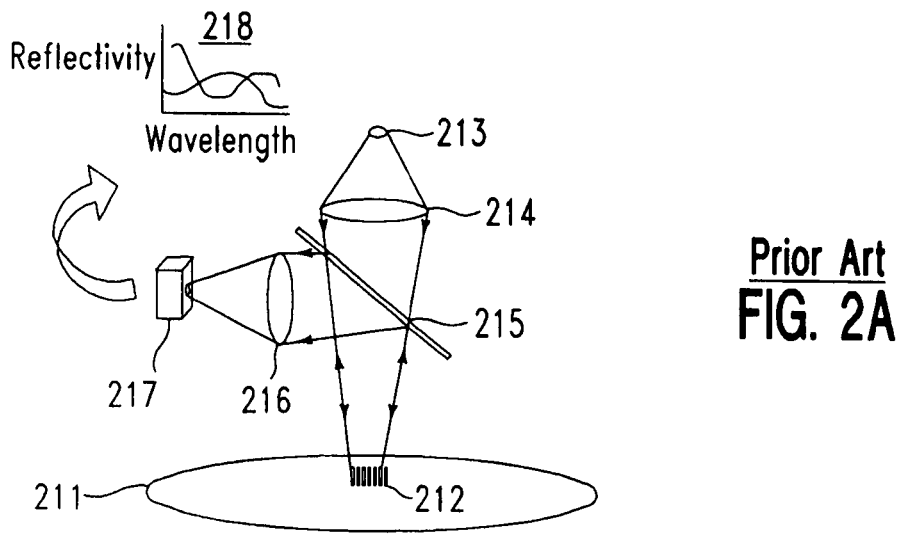
FIGS. 2A through 2C are block diagrams illustrating types of conventional scatterometry systems.
Figure 2B:
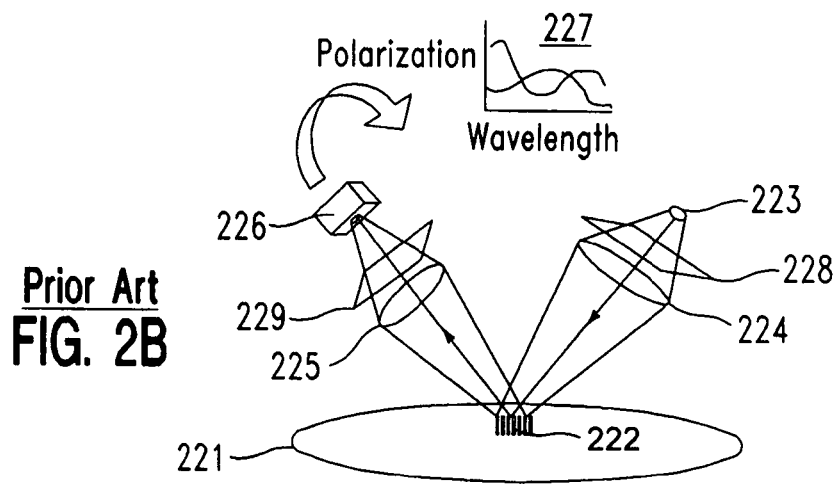
Figure 2C:
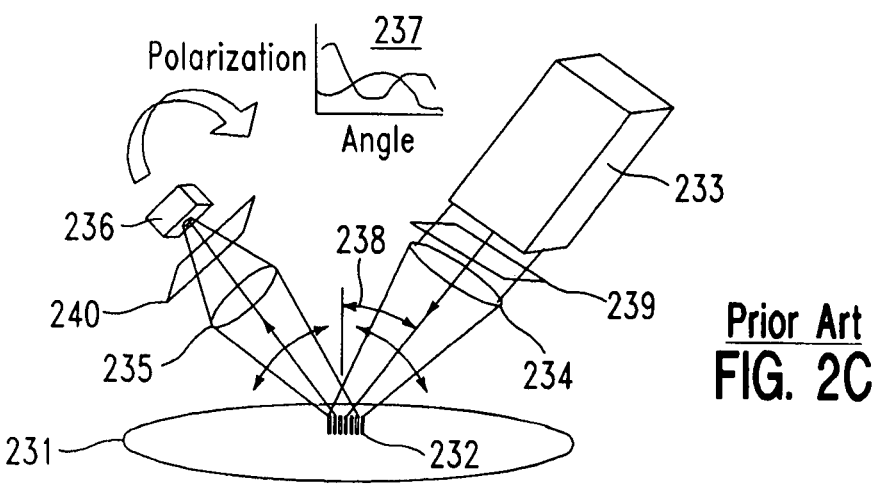
Figure 3:
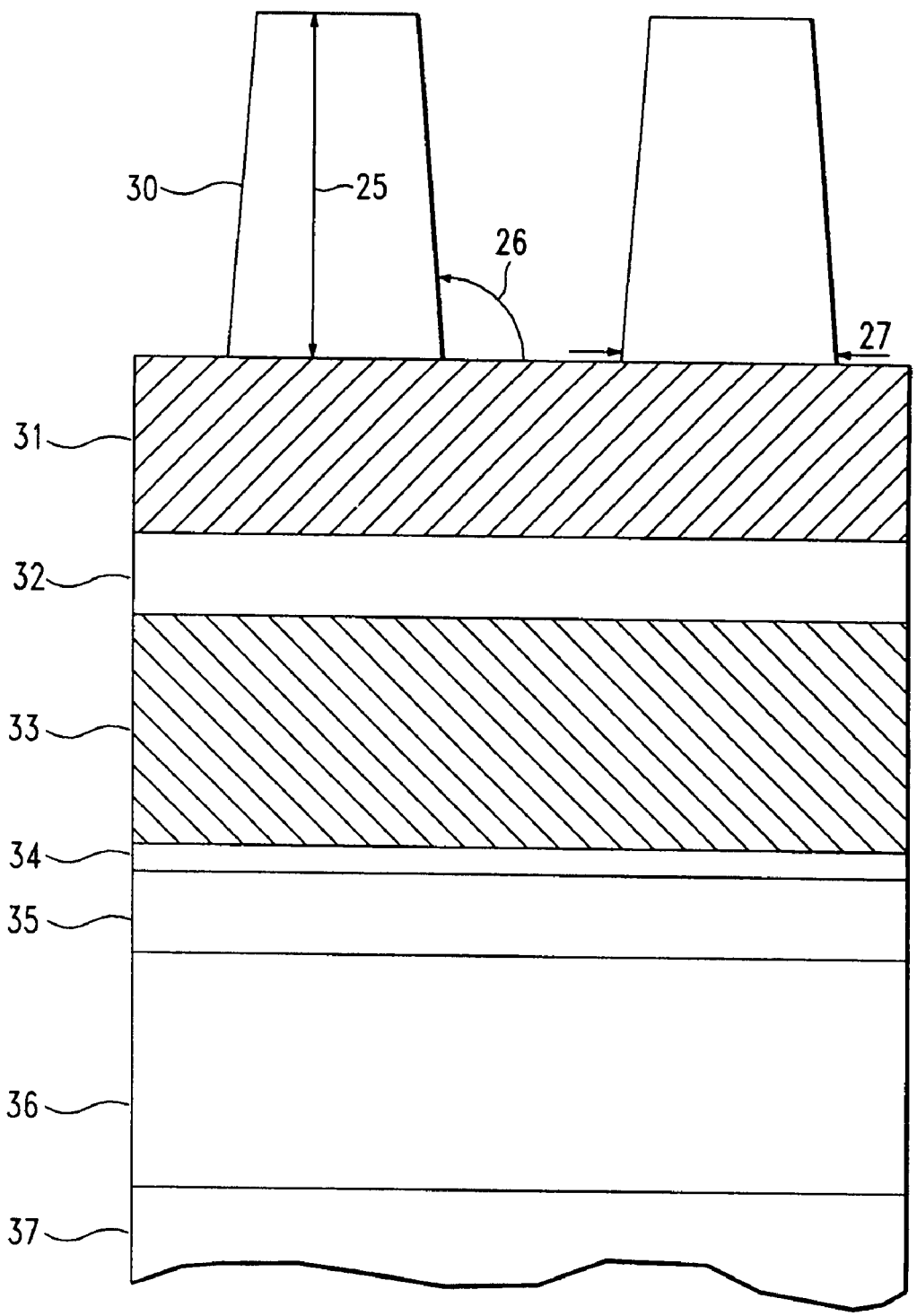
FIG. 3 is a cross-sectional view illustrating a scatterometry target model based on a patterned photoresist layer overlying a plurality of underlayers 30.
Figure 4:
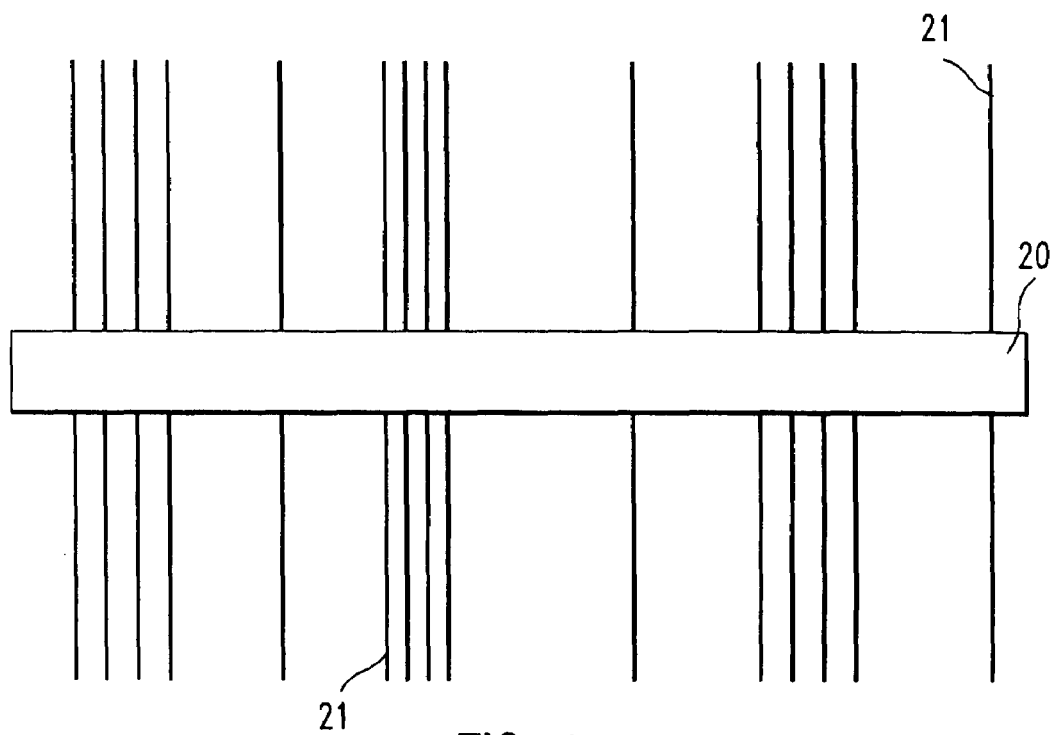
FIG. 4 illustrates a plan view of a prior art grating provided for CDSEM, the grating being designed for cleaving across lines thereof.
Figure 5:
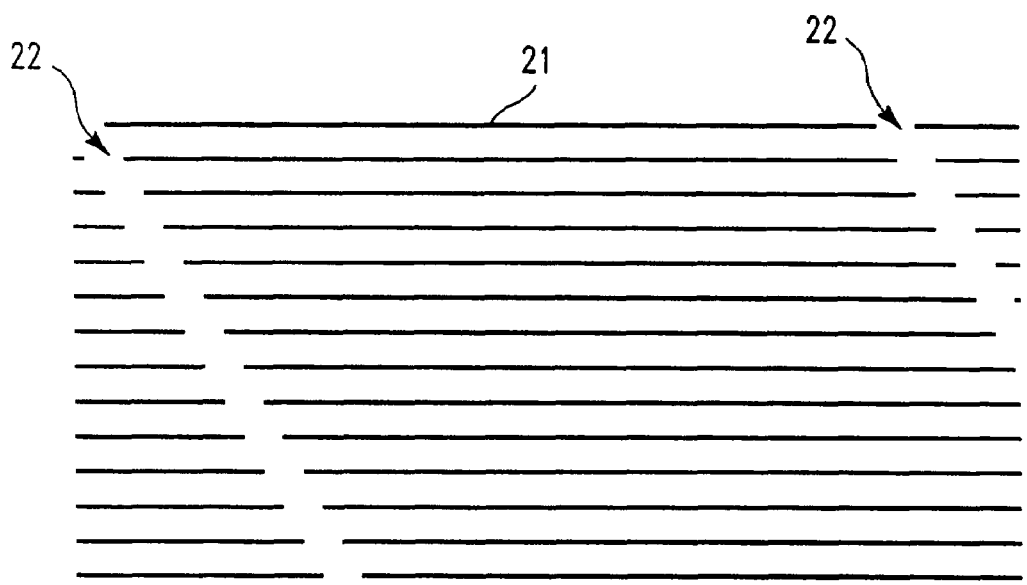
FIG. 5 is a plan view of a prior art CDSEM grating target having a plurality of gaps disposed in a non-orthogonal direction to the lines of the grating.
Figure 6:
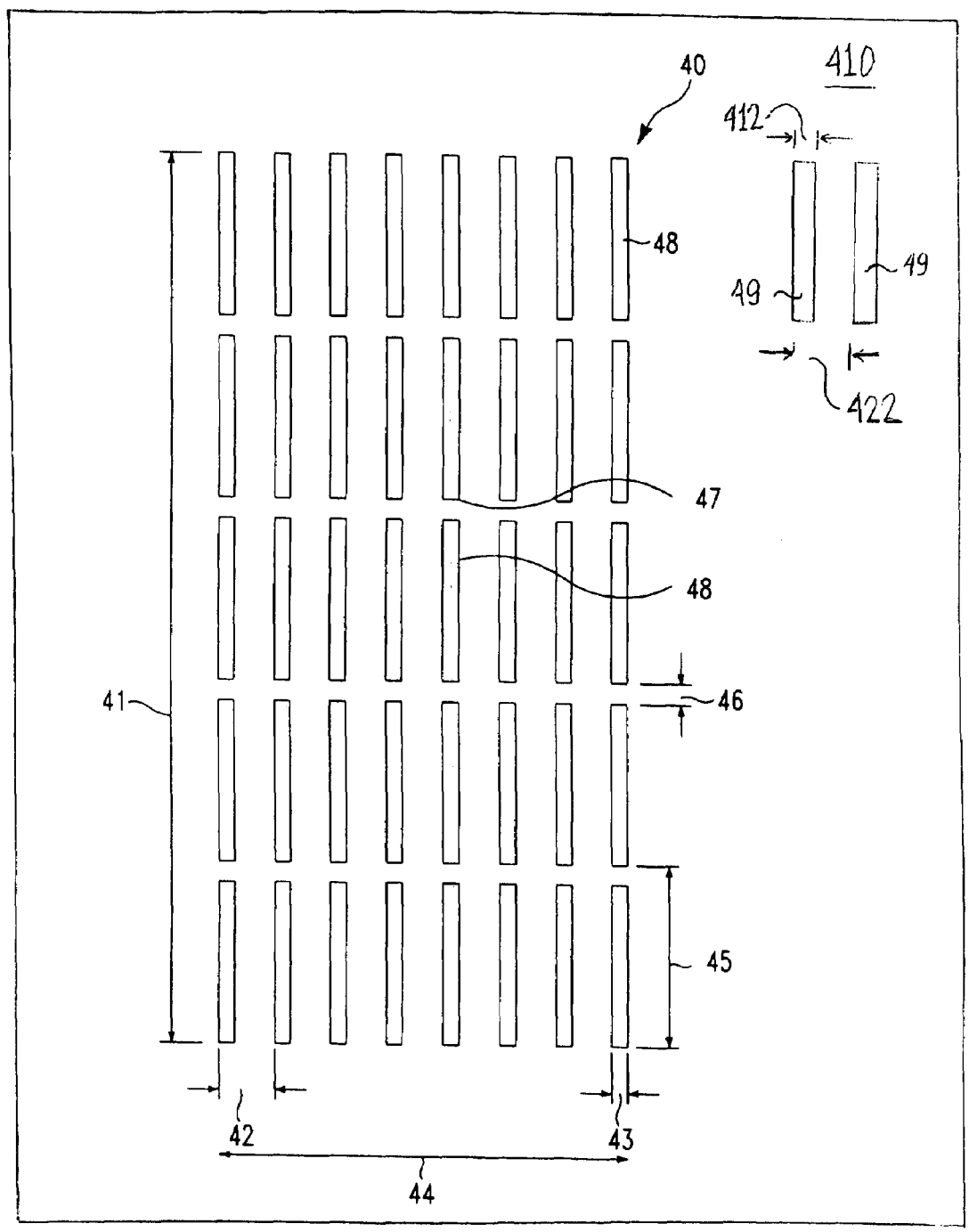
FIG. 6 is a plan view of a scatterometry grating according to an embodiment of the invention in which a plurality of gaps are provided in the lines of the grating to protect against pattern collapse.

FIG. 6 illustrates an embodiment of a scatterometry target 40 which is preferably patterned in a photoresist (hereinafter, "resist") layer of a sample 410 such as a wafer or substrate, the target 40 being a grating having a plurality of parallel elongated lines 48, each of the lines 48 having a lengthwise direction and a length 41 extending in the lengthwise direction. A plurality of gaps 47 are provided at intervals of the lines. The lines 48 are patterned to mimic features 49 of the sample, having a width 43 the same as the width of line features 49 of the sample, and a pitch 42 of the lines 48 being the same as the pitch of line features 49 of the sample. Thus, when the line features 49 of the sample 410 are patterned having a critical dimension width, the lines 48 of the grating 40 have width 43 at the same critical dimension. In a preferred embodiment, the ratio of the length to the width of the lines 48 is quite large, thus necessitating the gaps for stress relief. For example, the width of the lines for a representative current technology is a value between about one half and twice a critical dimension of 100 nm, i.e. between about 50 nm and 200 nm, while a typical length of the lines is about 50 μm. Thus, the ratio of length to width is greater than 50 in this example, and is approximately 500. Each gap 47 has a length $L_G$ 46. Gaps 47 are provided at periodic intervals 45 of the lines 48. The total width of the grating is indicated at 44. In the following description, the sample, wafer or substrate and the lines or line features thereof, while not specifically shown, are similar to that shown in FIG. 6.

The gaps 47 fortify the grating 40 against line collapse in the following way. When resist patterns are developed following a photolithographic exposure, surface tension of the developer liquid can tug on the patterns, causing them to fall over when the developer liquid is removed. The problem occurs especially when the developer liquid has already been removed from the space to one side of a line. The gaps 47 interfere with this mechanism, perhaps by channeling the developer liquid safely from between the lines to the edges of the grating and providing for more uniform removal of the liquid.

Figure 7:
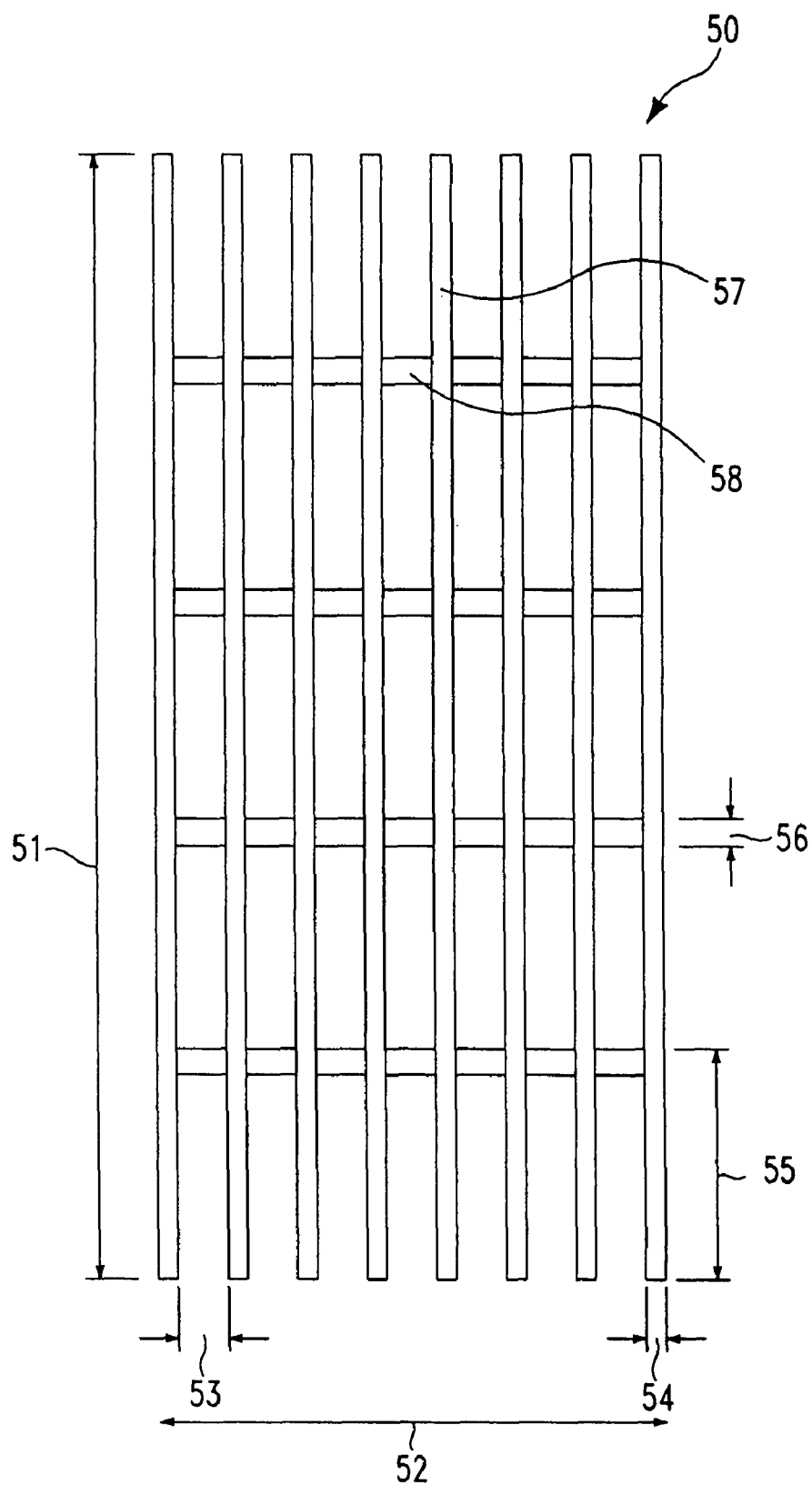
FIG. 7 is a plan view of a scatterometry grating according to an embodiment of the invention in which a plurality of bridges fortify the lines of the grating against collapse.

FIG. 7 illustrates another embodiment of a scatterometry target 50, preferably patterned in a resist layer of a sample such as a wafer or substrate (not shown). The dimensions of the grating are indicated at 51 and 52. The target 50 is a grating having a plurality of parallel elongated lines 57 having a lengthwise direction and a length 51 in the lengthwise direction. The lines 57 are patterned to mimic features of the sample, having a width 54 being the same as the width of line features (not shown) of the sample, and a spacing 53 between the lines which is the same as the spacing between the line features of the sample. A plurality of connecting features are provided as bridges 58 which connect together at least adjacent pairs of lines. In a preferred embodiment, the bridges extend to connect a multiplicity of the lines. The bridges extend in a direction transverse to the lengthwise direction of the lines 57, each bridge 58 having a length $L_B$ equal to the spacing 53 between the lines 57. Each bridge 58 further has a width 56. The bridges are disposed at a plurality of positions along the length 51 of each line, preferably at periodic intervals 55 of the lines 57.

To preserve reproducibility of scatterometry measurements, the gaps and/or bridges in the scatterometry grating must be located either entirely within the illuminated area or outside the area that is illuminated by the light beam of the scatterometer. For example, when the grating has length of 50 μm, a beam has an effective spot size of 40 μm, and a scatterometry placement accuracy of 5 μm is achieved, the grating should not have breaks or bridges located within 10 μm of the ends of the grating 40 to avoid impacting the measurements. However, in such example, bridges provided at the very ends of the grating 40, which thus lie outside the illuminated area and do not adversely affect results.

Commercially available scatterometry systems operate with zeroth order diffracted light. For this reason it does not matter whether alterations (gaps or bridges) made to the simple grating are arranged randomly or systematically. Therefore, the scatterometry targets according to the embodiments shown in FIGS. 6, 7 all have regularly spaced gaps and/or bridges, since such gaps and bridges are more easily designed.

However, should the system be designed to work only with higher order diffracted light based on the grating periodicity, there is an additional method to that which is discussed next to reduce the effect of the gaps and/or bridges on the scatterometry measurement. By distributing such alterations to the grating randomly throughout the grating or with a period different from the grating period, the light scattered by the alterations will not diffract coherently into the detected orders and so will not affect the detected signal. The effect of introducing bridges and/or gaps to the simple grating on scatterometry measurements can be best understood from the following.

As described as background above, scatterometry systems determine the geometry of a sample grating by finding the libraried model spectra that has the lowest Chi-square quantity. The part of the system that determines such solution is called the solver. Commercially available scatterometry solvers share certain features in common. In particular, the interference between light scattered off of the tops of the lines and off of the substrate is a prominent signature in the spectra for all the commercially available systems. From such signature, the height of the line structure can be accurately determined. Another feature of scatterometry solver operation is known as constant optical volume approximation.

When the solver is constrained to seek a solution within a particular scatterometry model, to first approximation a solution will be chosen having the same optical volume as the actual optical volume of the grating. Since the scatterometry model does not include bridges or gaps, the presence of these structures will cause the solver to seek a solution in which change in the optical volume is compensated by changing the line width of the model structure. In other words, the solver responds to the addition of these alterations by finding a simple grating solution having the same overall optical volume. In the application of this approximation to this invention, the optical volume can be replaced by the actual volume determined by the geometry of the grating. All embodiments involve adding or subtracting material having the same index of refraction as the material in which the lines of the grating are defined.

From the foregoing, a simple rule emerges. The fractional change in line width reported by scatterometry upon introducing these alterations is equal to the true fractional change in the line structure volume of the grating. For example, when a number $N_B$ of bridges are provided in the grating, each having line width $W_B$, height $H_B$ and length $L_B$, the total volume of the bridges is given by $$\text{Volume}_B = N_B W_B H_B L_B$$

while the volume of the lines of the original grating without the bridges is given by Volume=NWHL where N is the number of grating lines, W is the line width of the lines, H is the height of the lines, and L is the length of the lines. The fractional change in line width critical dimension reported by scatterometry is then given by $$\Delta CD/CD = \text{Volume}_B/\text{Volume}. \qquad \text{Eqn. 1}$$

In deriving this equation and others, the assumption is made that these changes to the measurement are small compared to the unfortified grating measurement, i.e., less than 10%, so that only leading order terms are kept in expansions. In the case of gaps, the change in line critical dimension will be negative and given by $$\Delta CD/CD = -\text{Volume}_G/\text{Volume} \qquad \text{Eqn. 2}$$

where the gap volume is given by metrics similar to those defined for bridges, i.e.: $\text{Volume}_G = N_G W H L_G$ where $N_G$ is the number of gaps in the grating and $L_G$ is the length of each gap. In general, the gap width and the gap height are the same as the lines of the grating because the gap volume is meant to measure the volume of missing grating line segments. In a case in which both bridges and gaps are provided, the change in critical dimension reported by scatterometry is given by $$\Delta CD/CD = (\text{Volume}_B - \text{Volume}_G)/\text{Volume} \qquad \text{Eqn. 3}$$

This last formula says that if equal optical volumes of bridges and gaps are introduced into the grating then there will be no net change in line width reported by scatterometry. There are multiple ways of achieving this equality depending on the N, W, H, and L for each feature type.

Figure 8:
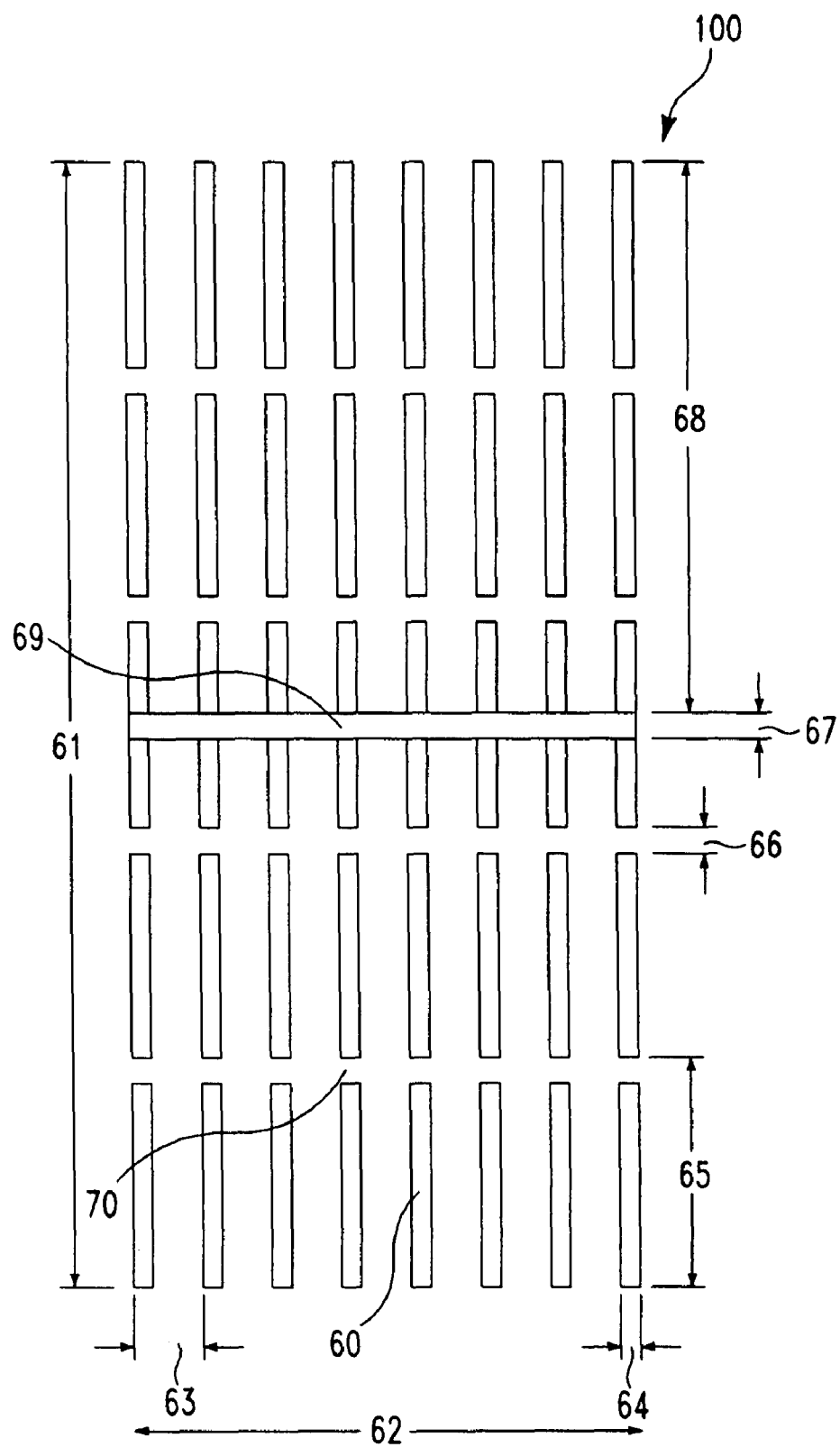
FIG. 8 is a plan view of a scatterometry grating according to an embodiment of the invention in which a plurality of both bridges and gaps fortify the lines of the grating against collapse.

An example of this principle is illustrated in FIG. 8. Another embodiment of a scatterometry target 100 is shown in FIG. 8 in which the target 100, being a grating, has a plurality of parallel elongated lines 60 patterned in a photoresist layer, the lines having a lengthwise direction and length 61 extending in the lengthwise direction. Gaps 70 are provided in the lines at periodic intervals 65, the gaps having length 66. The lines 60 are patterned to mimic features of the sample, having a width 64, being the same as the width of line features of the sample, and a pitch 63 of the lines which is the same as the pitch of line features of the sample. In addition, one or more bridges 69 are provided having a width 67 and are provided at periodic intervals 68 of the lines. The width of the grating is indicated at 62.

Like the embodiments shown in FIGS. 6 and 7, in the embodiment shown in FIG. 8 gaps and bridges are provided which help to prevent pattern collapse. However, an additional benefit is realized here. Ideally, the total optical volumes of the gaps are the same as the total optical volume of the bridges, such that the constant offset expressed by Eqn. 3 is equal to zero. However, a process dependent offset as expressed by Eqn. 8 below will still be present.

It is desirable not to require corrections to be made to the scatterometry measurement to determine the true line width. One version of the gauge maker's rule is that measurement uncertainty associated with the measurement system should be less than 2% of the nominal measurement. As an example, a grating having a space width of 700 nm and grating size of 50 µm has bridges for reinforcing the grating, where the bridge widths are equal to the line widths. The heights of the lines and the bridges are nominally equal. To satisfy this rule, then the number of bridges in the grating must satisfy $$2\% > (N_B L_B)/(NL)$$

This, in turn, reduces to $N_B/N < 1.4$.

In this case, only one bridge per grating line is permitted. On the other hand, if the grating space width were 100 nm, then this ratio becomes $$N_B/N < 10$$

which is much less restrictive. The more severe constraint for the large space width (also large pitch) is not a significant limitation of the present invention because pattern collapse is less a problem for large space width gratings.

As another example, consider a grating using gaps to prevent line collapse. In this case to satisfy the rule the following condition derived from Eqn. 2 must hold:

$$2\% > (N_G L_G)/(NL).$$

If the gap length $L_G$ is 200 nm and the grating length is 50 µm, then $$N_G/N < 5.$$

On the other hand, if the gap length is reduced to 50 nm, then $$N_G/N < 20.$$

In addition to a constant offset being introduced into the scatterometry measurement by the alteration, there can be process dependent offset changes which can introduce additional constraints on the number of allowed alterations to the grating. In particular, the requirement that the modified grating remains a good mimic of the critical dimension structure in the in-chip circuit element must be accommodated. In this context, mimic means that the scatterometry measurement changes in the same way to the degree of the measurement precision and accuracy requirement as the in-chip critical dimension as a result of manufacturing process variation. Phenomena such as line end shortening and corner rounding change by a greater degree than the bottom line width in response to lithography tool defocus. More generally, the ends of lines, either at gaps or at the intersection of bridge line and grating line, change more than the typical critical dimension, the bottom line width. Line ends can shorten at a rate approximately several times the rate that bottom line width shrinks. This implies that the length of gaps will grow at a rate many times the rate that bottom line width shrinks. Consider a process variation that changes the width of the grating line by $\delta W$ and because of line end shortening there is a change in the gap length by $\delta L_G$. This discussion implies that $\delta L_G = -f_G \delta W$ where $f_G$ is some process dependent factor possibly as large as 10. Using Eqn. 2 these changes produce a change in the line width critical dimension reported by scatterometry $\delta CD$ given by $$\delta CD = \delta W - (V_G/V) W (\delta L_G/L_G). \qquad \text{Eqn. 4}$$

Upon using the definitions for $V_G$ and V and the suggested relationship between $\delta L_G$ and $\delta W$ this reduces to $$\delta CD = \delta W \{1 + f_G (N_G/N)(W/L)\}. \qquad \text{Eqn. 5}$$

Another variation of the gauge maker's rule is the following: the measurement uncertainty (precision and accuracy) associated with the measuring system should be less than 20% of the allowed range of variation (process window). If $\delta W$ represents this allowed range, then the quantity $f_G(N_G/N)(W/L)$ should be designed to be less than 20%. For example, if the design width of the grating line W is 100 nm, L is 50 um and $f_G=10$ then $$N_G/N<10.$$

Bridges introduce qualitatively similar considerations since at the intersection of the bridge line and the grating line, the lithographic printing behavior of this geometry can be very different from the long grating line. The resulting condition on the number of bridges becomes $$\delta CD=\delta W+(\delta V_B/V)W \qquad \text{Eqn. 6}$$

where $\delta V_B$ represents the change in bridge volume due to process variation. This takes the form of corner rounding at the intersection. The following equation formally expresses the effect in term of the process factor $f_B$ for bridges:

$$\delta CD=\delta W\{1+f_B(N_B/N)(W/L)\}. \qquad \text{Eqn. 7}$$

In the situation where both gaps and bridges are introduced into the grating the process dependent offset would be given by $$\delta CD=\delta W\{1+(f_G(N_G/N)+f_B(N_B/N))(W/L)\}. \qquad \text{Eqn. 8}$$

Since a typical bridge has a significantly greater volume than a typical gap, the constant offset constraint as calculated by Eqn. 1 will generally dominate over the process dependent offset constraint imposed by Eqn. 7. For gaps, the constraint imposed by process dependent offset as calculated by Eqn. 5 generally dominates over the constraint imposed by the constant offset as calculated by Eqn. 2.

Figure 9:
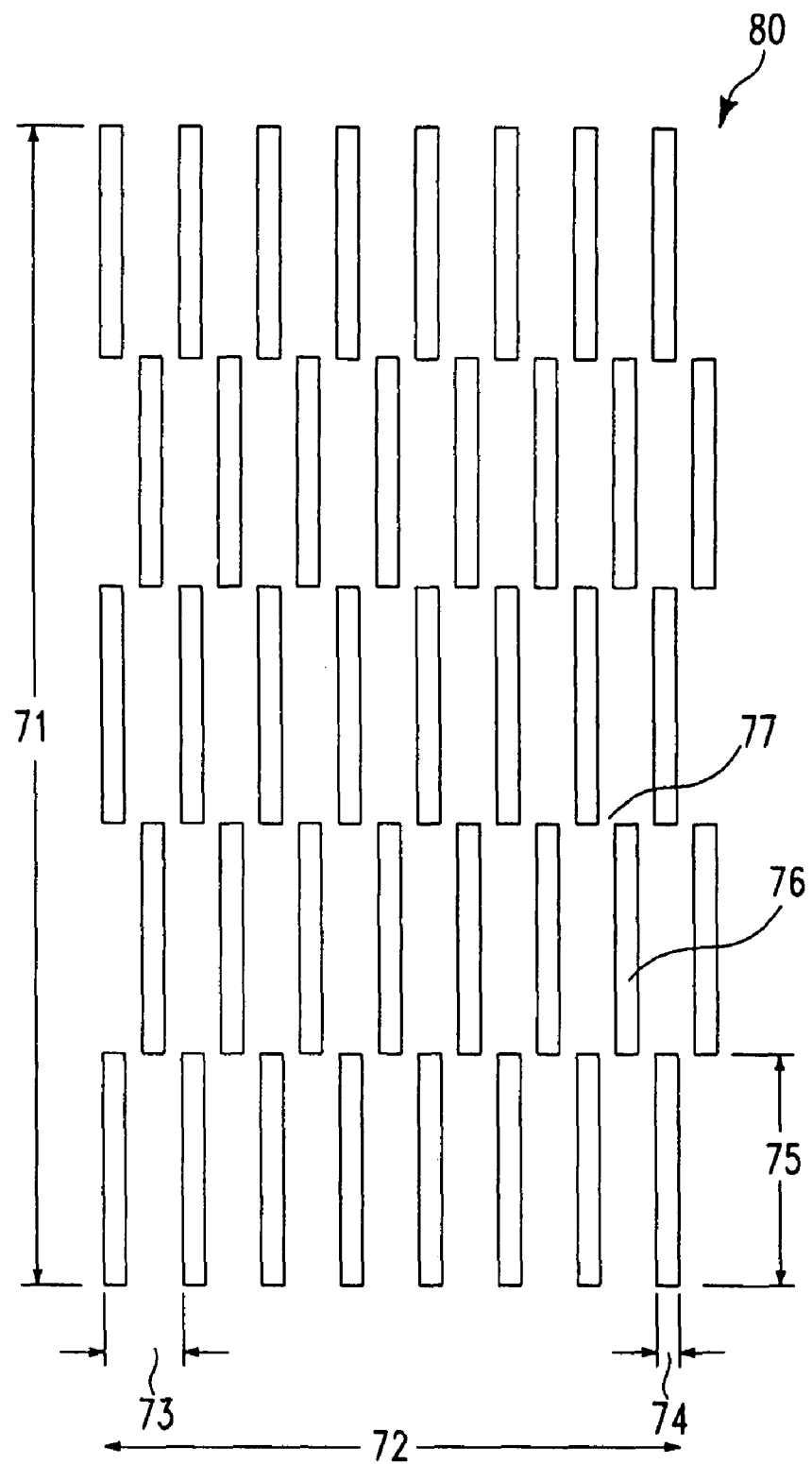
FIG. 9 is a plan view of a scatterometry grating according to an embodiment of the invention in which a plurality of jogs fortify the lines of the grating against collapse.

In another embodiment, illustrated in FIG. 9, a scatterometry target 80 is provided in which the target, being a grating, has a plurality of parallel lines 76. Jogs 77 are provided in the lines at periodic intervals 75. The lines 76 are patterned to mimic features of the sample (not shown), having a width 74, being the same as the width of line features (not shown) of the sample, and a pitch 73 of the lines which is the same as the pitch of line features of the sample. The dimensions of the grating are indicated at 71 and 72. When jogs 77 are provided, as shown in FIG. 9, rather than breaks or bridges, there is no net change in optical volume from the simple grating, so no change in line width reported by scatterometry is expected.

In a particular embodiment, at each jog the grating lines are displaced by half the period of the grating. By design, there is not net change in the optical volume of the grating lines so no constant offset in scatterometry measurement occurs. However, there are now line ends within the grating so a process dependent offset will be present. Following the above derivations for a case in which gaps are provided, the following equation expresses the process dependent offset for jogs as $$\delta CD=\delta W\{1+f_J(N_J/N)(W/L)\} \qquad \text{Eqn 9}$$

where $f_J$ is the process factor characterizing the line end shortening effect due to lithography process variation and $N_J$ is the number of jogs introduced into the grating.

Accounting for the reduction in optical volume due to line end shortening at the jogs, and following the analysis above regarding gaps and/or bridges in the grating, a suitable scatterometry measurement is obtained so long as $$f_J(N_J/N)(W/L)<2\%$$

where $N_J$ is the number of jogs per a line of length L and N is the number of lines of the grating having length L and width W.

The process factors $f_G$, $f_B$, and $f_J$ are difficult to calculate. In addition, while there is a range of process variation over which the factors are constant, having a linear relationship between the change in bottom line width and the change in line ends or the change in corner rounding, the range is difficult to calculate. Therefore, conservative estimates for these process factors have been used to determine the domain of alteration sizes the are not expected to affect the scatterometry measurement. However, if the above algorithms are to be extended to alterations having greater optical volumes, the scatterometry system needs to be calibrated, both for the instrument and the target.

The calibration process is straightforward. However, it adds to the expense of using scatterometry (COO). Wafer samples or artifacts are produced for which manufacturing process variations are deliberately forced, the samples having scatterometry targets thereon. The scatterometry targets are measured by a reference measurement system such as any of the above systems, e.g., CDSEM, CDAFM, etc. Correlation analysis is then performed on the data thus obtained, and scatterometry measurements are taken from the same targets. The correlation analysis determines the correction formula to be applied to the raw scatterometry measurement to produce the corrected critical dimension measurement. This exercise is expected to confirm an acceptable range of linear behavior as constant process factors, a correlation slope β and an intercept α. The corrected critical dimension $CD_C$ is then derived from the critical dimension measurement CD obtained by scatterometry according to the formula $$CD_C=\beta CD+\alpha.$$

Up to this point, the discussion has been focused on determining a scatterometry target that eliminates pattern collapse while preserving the target as a good mimic of critical dimension elements of a chip. This has led to constraints on the optical volume of the alterations including the number of such alterations in the grating.

The same equations derived for that purpose can be used for a very different purpose. Equations 5-9 estimate the magnitude of the process sensitive offset introduced by the alterations. Accordingly, the equations detailed above determine the conditions under which scatterometry targets can be constructed as monitors which are sensitive to manufacturing process variations.

Figure 10:
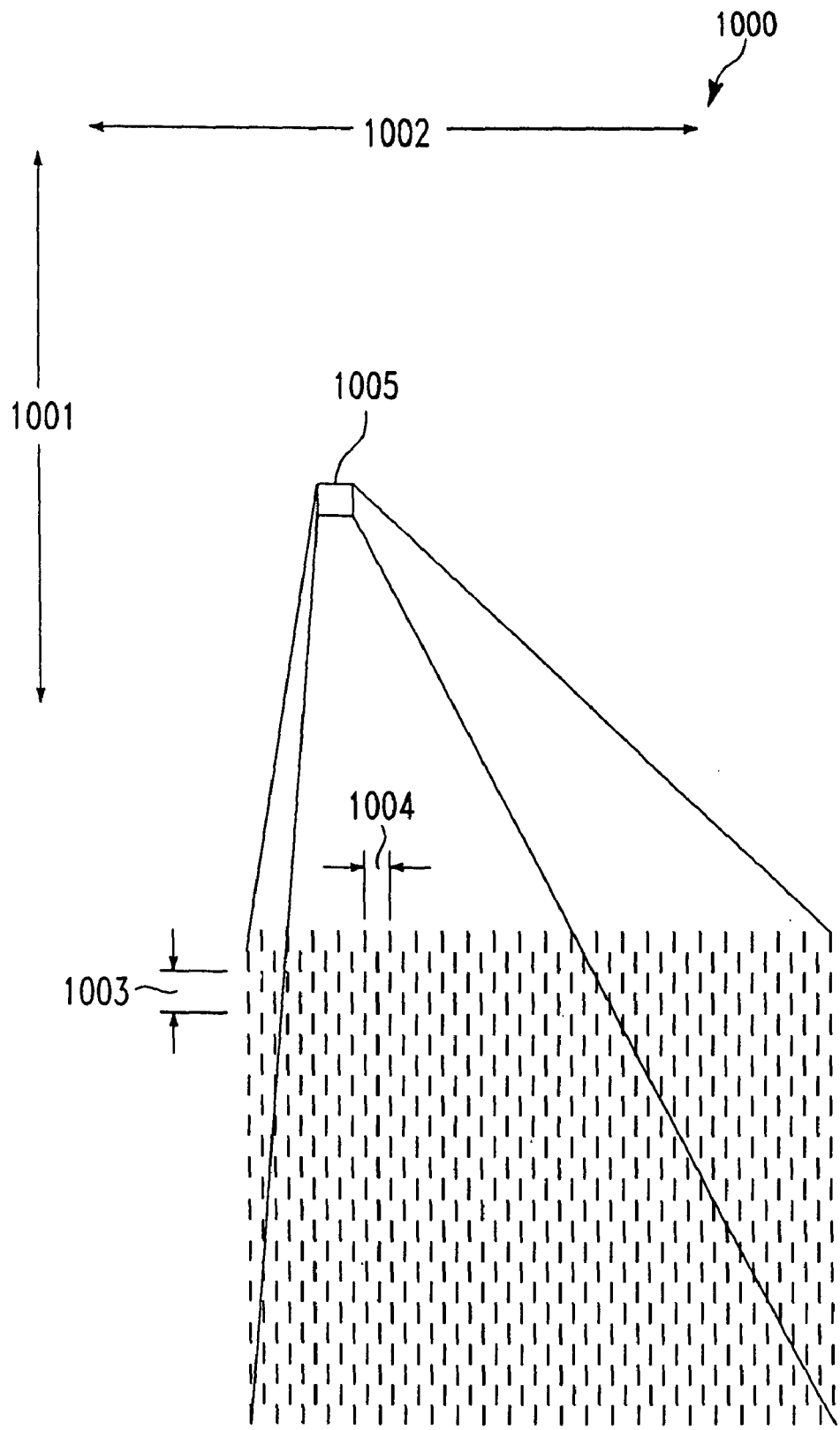
FIG. 10 is a plan view of a scatterometry grating according to an embodiment of the invention in which a multiplicity of jogs at short intervals are provided, such jogs causing the grating to be a sensitive monitor of lithography process conditions.

FIG. 10 illustrates an embodiment of a scatterometry grating target 1000 according to the invention which has a high degree of jog alteration for the purpose of monitoring lithography process. As shown in FIG. 10, the overall size of the grating 1000 is defined by the dimensions 1001 and 1002. A portion 1005 of the grating is shown in greater detail where the grating period is defined by the pitch 1004 and the jog period is defined by feature 1003.

To construct such sensitive manufacturing process monitors, the offsets detailed in equations 7 through 9 should be very large. For example, in the case of gaps, designing the target such that the relation $$f_G(N_G/N)(W/L)>1$$

makes the scatterometry measurement more sensitive to line end shortening variation than to CD variation. For example, when $f_G$ is estimated to have a value of four, rather than a conservative estimate of two, a width of the grating line W=100 nm, and L=50 μm, then this inequality implies $$N_G/N>125.$$

This implies that having gaps spaced more closely than every 400 nm will achieve the design goal. Since line end shortening has been used in other conceptual target designs as effective lithography defocus monitors (for example, OCD), this allows scatterometry to provide an alternative method to monitor photolithographic defocus. The same result obtains when jogs are considered because the process dependent offset for jogs is also governed by line end shortening. In this case the necessary condition becomes $$f_r(N_f/N)(W/L) > 1.$$  Eqn. 10

In a preferred embodiment of a scatterometry target used as a lithography process monitor, two gratings are provided. One is a grating with jogs spaced closer than every 400 nm, or having different values of the grating dimensions, whichever satisfies Eqn. 10. The second grating is a similar grating but is simpler, having no alterations, or having only sufficient alterations to prevent pattern collapse. Using jogs produces a design with no net change in optical volume between the two gratings so the two scatterometry measurements at optimum printing conditions are equal. Since CD variation and line end shortening behave differently as a function of lithography dose and defocus, then these two scatterometry measurements can be used to determine the actual lithography dose and defocus printing conditions.

In a preferred embodiment, the lines of the target 1000 are set to the critical dimension of the features of the sample and the interval length between jogs of the target 1000 is less than about ten times the critical dimension. More preferably, the interval length between jogs of the target 1000 is set to four times the critical dimension.

As with other process monitors, use of scatterometry for lithography process monitoring requires a calibration exercise that is different from a CD calibration exercise. A wafer artifact is constructed by intentionally varying the lithography focus F and dose D conditions from one printed field to the next in a focus exposure matrix pattern (hereinafter "FEM"). Scatterometry measurements are then taken in all printed fields on the two gratings. Let $CD_1$ and $CD_2$ be the two scatterometry measurements from the two gratings. Then these two quantities are different functions of F and D:

$$CD_1 = f_1(F,D)$$

$$CD_2 = f_2(F,D)$$

Typically, the functional dependence on dose is linear to good approximation, while the functional dependence on focus is quadratic with a minimum or maximum value at the best focus condition $F_0$. These equations can then be written in the following form:

$$CD_1 = a_0 + a_1 D + a_2 (F-F_0)^2$$  Eqn. 11

$$CD_2 = b_0 + b_1 D + b_2 (F-F_0)^2$$  Eqn. 12 where estimates for coefficients $a_0$, $a_1$, $a_2$, $b_0$, $b_1$, $b_2$ can be determined by nonlinear multi-variable regression. These two equations can generally be solved to produce two new equations thereby completing the calibration exercise:

$$F = g_1(CD_1, CD_2)$$

$$D = g_2(CD_1, CD_2)$$

Future scatterometry measurements can then use these functions $g_1$ and $g_2$ to report the lithography conditions of focus and dose. In the particular example, given Eqns. 11 and 12, and solving for F and D, these equations become $$D = \frac{b_2}{a_1 b_2 - a_2 b_1}(CD_1 - a_0) - \frac{a_2}{a_1 b_2 - a_2 b_1}(CD_2 - b_0)$$

$$F = F_0 \pm \sqrt{\frac{a_1}{a_1 b_2 - a_2 b_1}(CD_2 - b_0) - \frac{b_1}{a_1 b_2 - a_2 b_1}(CD_1 - a_0)}$$

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of monitoring a photolithographic process, comprising:
    (a) using a photolithographic process to pattern a substrate to form (i) a scatterometry target having a plurality of parallel elongated features, each elongated feature having a length in a lengthwise direction and a plurality of stress-relief features including gaps disposed at a plurality of positions along the length of each elongated feature, the gaps interrupting the elongated features and (ii) other features, each of the other features having at least one of a microelectronic function or a micro-electromechanical function;
    (b) detecting a return signal in response to illumination of the scatterometry target wherein the gaps are adapted to produce a return signal which mimics a return signal from a scatterometry target that does not have the stress-relief features; and
    (c) using the return signal to determine a result of the photolithographic process.

2. A method of monitoring a photolithographic process as claimed in claim 1, wherein a ratio of a length of the scatterometry target in the lengthwise direction to the width of each elongated feature is greater than 50.

3. A method of monitoring a photolithographic process as claimed in claim 1, wherein a width of each elongated feature mimics a width of at least some of the other features.

4. A method of monitoring a photolithographic process as claimed in claim 1, wherein each elongated feature has jogs disposed at a plurality of locations along the length of the elongated feature, wherein the jogs cause the return signal to be sensitive to photolithographic defocus.

5. A method of monitoring a photolithographic process as claimed in claim 1, wherein the stress-relief features include connecting features which connect pairs of the parallel elongated features in a direction transverse to the lengthwise direction.

6. A method of monitoring a photolithographic process as claimed in claim 1, wherein the width of the elongated features is at critical dimension.

7. A method of monitoring a photolithographic process as claimed in claim 1, wherein the scatterometry target overlies a structure layer, and step (c) includes comparing the return signal to stored signals of a library, the stored signals of the library representing an effect of the structure layer on the return signal.

8. A method as claimed in claim 1, wherein the substrate includes a photoimageable layer and the scatterometry target and the other features are patterned in the photoimageable layer.

9. A method of monitoring a photolithographic process, comprising:
    (a) patterning a photoimageable layer to form (i) a scatterometry target having a plurality of parallel elongated features having length extending in a lengthwise direction and a plurality of stress-relief features including gaps disposed at a plurality of positions along the length of each elongated feature, the gaps interrupting the elongated features and (ii) other features, each of the other features having at least one of a microelectronic function or a microelectromechanical function, wherein a ratio of a length of the scatterometry target in the lengthwise direction to the width of each elongated feature is greater than 50, and the width of each elongated feature mimics a width of the other features;

(b) illuminating the scatterometry target;

(c) detecting a return signal from the scatterometry target, wherein the gaps are adapted to produce a return signal which mimics a return signal from a scatterometry target that does not have the stress-relief features;

(d) comparing the return signal to signals of a library of stored signals to determine a match; and (e) monitoring a photolithographic process based on the determined match.

* * * * *